(12) United States Patent
Huh et al.

(10) Patent No.: US 11,784,392 B2
(45) Date of Patent: Oct. 10, 2023

(54) HIGH FREQUENCY FILM TRANSMISSION LINE, ANTENNA COMPRISING SAME, AND IMAGE DISPLAY DEVICE HAVING ANTENNA COUPLED THERETO

(71) Applicant: DONGWOO FINE-CHEM CO., LTD., Jeollabuk-do (KR)

(72) Inventors: Yoon Ho Huh, Seoul (KR); Jong Min Kim, Gyeonggi-do (KR); Dong Pil Park, Incheon (KR)

(73) Assignee: DONGWOO FINE-CHEM CO., LTD., Jeollabuk-Do (KR)

(*) Notice: Subject to any disclaimer, the term of this patent is extended or adjusted under 35 U.S.C. 154(b) by 489 days.

(21) Appl. No.: 17/169,781

(22) Filed: Feb. 8, 2021

(65) Prior Publication Data
US 2021/0203056 A1 Jul. 1, 2021

Related U.S. Application Data

(63) Continuation of application No. PCT/KR2019/009468, filed on Jul. 30, 2019.

(30) Foreign Application Priority Data

Aug. 6, 2018 (KR) .................. 10-2018-0091155

(51) Int. Cl.
*H05K 1/00* (2006.01)
*H05K 1/02* (2006.01)
(Continued)

(52) U.S. Cl.
CPC .............. *H01Q 1/22* (2013.01); *H01P 3/08* (2013.01); *H01Q 1/38* (2013.01); *H05K 1/147* (2013.01);
(Continued)

(58) Field of Classification Search
CPC .. H05K 1/00; H05K 1/02; H05K 1/18; H05K 1/118; H05K 1/147; H01Q 1/22;
(Continued)

(56) References Cited

U.S. PATENT DOCUMENTS 6,280,861 B1 * 8/2001 Hosokawa ........... H10K 50/813
 428/209
6,344,658 B1 * 2/2002 Nakagawa ............... H03B 9/14
 257/497
(Continued)

FOREIGN PATENT DOCUMENTS

| CN | 101098044 A | 1/2008 |
| CN | 102934531 A | 2/2013 |

(Continued)

OTHER PUBLICATIONS

International Search Report for PCT/KR2019/009468 dated Nov. 11, 2019.
(Continued)

*Primary Examiner* — Xiaoliang Chen
(74) *Attorney, Agent, or Firm* — The PL Law Group, PLLC

(57) ABSTRACT

A film transmission line according to an embodiment of the present invention includes a dielectric layer, and an electrode line disposed on the dielectric layer. The electrode line has an effective efficiency of 200%/µm or more at a frequency of 5 GHz or more. The film transmission line may be applied to a high frequency thinned antenna and an image display device.

18 Claims, 7 Drawing Sheets

(51) Int. Cl.
*H05K 1/18* (2006.01)
*H01Q 1/22* (2006.01)
*H01Q 1/38* (2006.01)
*H01P 3/08* (2006.01)
*G02F 1/1368* (2006.01)
*H05K 1/14* (2006.01)
*H10K 59/12* (2023.01)

(52) U.S. Cl.
CPC .............. *H05K 1/18* (2013.01); *G02F 1/1368* (2013.01); *H05K 2201/10098* (2013.01); *H05K 2201/10128* (2013.01); *H05K 2201/10136* (2013.01); *H05K 2201/10159* (2013.01); *H10K 59/12* (2023.02)

(58) Field of Classification Search
CPC . H01Q 1/38; H01Q 1/248; H01P 3/08; H10K 59/12; H10K 59/13; H10K 85/30; H10K 85/60; H10K 85/321; H10K 85/361; H10K 85/371; G02F 1/1368; H01L 31/0321; H01L 31/0549
USPC .......... 361/749; 257/6, 72, 76, 99, 275, 497, 257/664; 438/478
See application file for complete search history.

(56) References Cited

U.S. PATENT DOCUMENTS

| | | | | | |
|---|---|---|---|---|---|
| 6,954,025 | B2* | 10/2005 | Nishida | ............... | H02N 2/188 310/319 |
| 10,312,743 | B2* | 6/2019 | Ouda | ............... | H02J 50/20 |
| 2001/0028060 | A1* | 10/2001 | Yamazaki | ............ | H01L 27/1214 257/E29.279 |
| 2005/0031003 | A1* | 2/2005 | Krupke | ................. | H01S 3/0943 372/56 |
| 2010/0017922 | A1* | 1/2010 | Shin | ....................... | B82Y 35/00 385/12 |
| 2010/0109018 | A1* | 5/2010 | Chen | ..................... | C30B 29/406 257/E29.091 |
| 2011/0304311 | A1* | 12/2011 | Takahashi | ........... | H01L 27/1225 323/311 |
| 2015/0137336 | A1* | 5/2015 | Kawamura | ......... | H01L 25/0657 257/664 |
| 2015/0333534 | A1* | 11/2015 | Liu | .......................... | H02J 5/00 307/104 |
| 2018/0277696 | A1* | 9/2018 | Karunadasa | ........ | H01L 31/0321 |
| 2018/0358845 | A1* | 12/2018 | Criswell | ................. | H02J 50/80 |
| 2022/0405310 | A1* | 12/2022 | Zhu | .................... | G06F 16/24558 |

FOREIGN PATENT DOCUMENTS

| | | |
|---|---|---|
| CN | 103181247 A | 6/2013 |
| CN | 105742797 A | 7/2016 |
| CN | 106932947 A | 7/2017 |
| KR | 10-2016-0059291 A | 5/2016 |
| KR | 10-2016-0080444 A | 7/2016 |
| KR | 10-2016-0104125 A | 9/2016 |
| KR | 10-1784501 B1 | 11/2017 |

OTHER PUBLICATIONS

Liu, Ai Qun. "Coplanar Waveguide Transmission Line", "RF MEMS Switches and Integrated Switching Circuits" See pp. 83, 86; and figures 4.1(a)-4.1(b), 4.27-4.28.

* cited by examiner

HIGH FREQUENCY FILM TRANSMISSION LINE, ANTENNA COMPRISING SAME, AND IMAGE DISPLAY DEVICE HAVING ANTENNA COUPLED THERETO

CROSS REFERENCE TO RELATED APPLICATIONS AND CLAIM OF PRIORITY

The present application is a continuation application to International Application No. PCT/KR2019/009468 with an International Filing Date of Jul. 30, 2019, which claims the benefit of Korean Patent Application No. 10-2018-0091155 filed on Aug. 6, 2018 at the Korean Intellectual Property Office, the disclosures of which are incorporated by reference herein in their entirety.

BACKGROUND

Technical Field

The present invention relates to a high frequency film transmission line, an antenna including the same, and an antenna-integrated image display device.

Background Art

Recently, according to development of the information-oriented society, wireless communication techniques such as Wi-Fi, Bluetooth, and the like are implemented, for example, in a form of smartphones by combining with display devices. In this case, an antenna may be coupled to the display device to perform a communication function.

Recently, with mobile communication techniques becoming more advanced, it is necessary for an antenna for performing communication in ultra high frequency bands to be coupled to the display device. In addition, as communication functions implemented in one display device are increased, the display device may include a plurality of antennas having sensitivity to different frequencies coupled thereto.

The plurality of antennas are connected with each other by antenna wirings such as a transmission line. However, as various driving circuit chips, memory devices, sensor chips, and the like are integrated in the display device, a space or area, in which the antenna wirings can be arranged, is reduced. Accordingly, a path of the antenna wirings may be bypassed or lengthened, thereby causing an increase in a signal resistance.

In addition, the display device includes various circuit structures such as resistors, capacitors and condensers, and antenna signals may be interfered or disturbed due to a noise generated by the circuit structures.

Accordingly, an antenna and a wiring design having excellent signal transmission efficiency in a more compact size than the existing antenna while minimizing an influence from the noise are required.

For example, Korean Patent Laid-Open Publication No. 2016-0059291 discloses an antenna integrally formed with a display panel, however, it did not provide an alternative idea to solve the above-described problems.

SUMMARY

It is an object of the present invention to provide a high frequency film transmission line having improved signal efficiency and reliability.

In addition, another object of the present invention is to provide an antenna including the high frequency film transmission line.

Further, another object of the present invention is to provide an antenna-integrated image display device having improved signal efficiency and reliability.

To achieve the above objects, the following technical solutions are adopted in the present invention.

1. A film transmission line comprising:
a dielectric layer; and
an electrode line disposed on the dielectric layer,
wherein the electrode line has an effective efficiency of 200%/μm or more, which is defined by Equation 1 below, at a frequency of 5 GHz or more:

$$\text{Effective efficiency} = \frac{\text{Signal transmission efficiency}(\%)}{\text{Electrode line thickness}(\mu m)} \quad \text{[Equation 1]}$$

(In Equation 1, the signal transmission efficiency is defined by Equation 2 below)

$$\text{Signal transmission efficiency}(\%) = \left(\frac{\text{Output power}}{\text{Input power}}\right) \times 100. \quad \text{[Equation 2]}$$

2. The film transmission line according to claim 1, wherein the film transmission line has a signal loss level S21 value of −3 dB or more, which is defined by Equation 3 below, and the electrode line has a thickness of 100 to 500 nm:

$$S21(\text{dB}) = 10 \times \text{Log}\left(\frac{\text{Output power}}{\text{Input power}}\right). \quad \text{[Equation 3]}$$

3. The film transmission line according to claim 2, wherein the electrode line has a thickness of 200 to 300 nm.

4. The film transmission line according to claim 1, wherein the electrode line comprises a signal line and a ground line.

5. The film transmission line according to claim 4, wherein the ground line comprises a first ground line and a second ground line, and the signal line is disposed between the first ground line and the second ground line.

6. The film transmission line according to claim 1, wherein the electrode line comprises at least one selected from the group comprising silver (Ag), gold (Au), copper (Cu), aluminum (Al), platinum (Pt), palladium (Pd), chromium (Cr), titanium (Ti), tungsten (W), niobium (Nb), tantalum (Ta), vanadium (V), iron (Fe), manganese (Mn), cobalt (Co), nickel (Ni), zinc (Zn), tin (Sn), and an alloy thereof.

7. The film transmission line according to claim 6, wherein the electrode line comprises silver, copper or an alloy thereof.

8. The film transmission line according to claim 1, wherein the electrode line comprises a mesh structure.

9. The film transmission line according to claim 8, further comprising a dummy pattern disposed around the electrode line and having a same mesh structure as the mesh structure of the electrode line.

10. The film transmission line according to claim 1, wherein the film transmission line further comprises a ground layer disposed on a lower surface of the dielectric layer.

11. The film transmission line according to claim 1, wherein the film transmission line is driven at a frequency of 20 GHz or more.

12. An antenna comprising:
the film transmission line according to claim 1; and
an antenna electrode electrically connected with the film transmission line.

13. The antenna according to claim 12, wherein the antenna electrode comprises a radiation electrode, and a pad electrode electrically connected with the electrode line of the film transmission line.

14. An image display device comprising:
a printed circuit board;
an antenna mounted on the printed circuit board;
a display panel disposed on the printed circuit board; and
the film transmission line according to claim 1 disposed on the display panel and electrically connected with the antenna.

15. The image display device according to claim 14, wherein the image display device further comprises an electronic element mounted on the printed circuit board.

16. The image display device according to claim 14, wherein the image display device further comprises a connection structure electrically connecting the film transmission line and the antenna with each other.

17. The image display device according to claim 16, wherein the connection structure comprises a flexible printed circuit board (FPCB).

18. The image display device according to claim 17, wherein the connection structure is connected with one end of the electrode line included in the film transmission line, and extends toward the printed circuit board through a peripheral region of the image display device to be connected with the antenna.

According to embodiments of the present invention, the film transmission line may include an electrode pattern having an effective efficiency of 200%/μm or more at a thickness of about 500 nm or less. Accordingly, signal transmission efficiency at a high frequency band may be improved while suppressing an excessive increase in a thickness of the film transmission line.

In some embodiments, a plurality of antennas may be connected with each other by the film transmission line. Accordingly, a signal loss between the plurality of antennas may be prevented and a size of the antenna structure may be reduced.

In some embodiments, the film transmission line and the antenna may be disposed with being spaced apart from each other on different layers or different levels with the display panel of the image display device interposed therebetween. Accordingly, the transmission lines may be arranged without restriction of a space due to a display driving integrated circuit (IC) chip, a memory element, and the like, which are disposed on a printed circuit board (PCB) of the image display device. Therefore, a signal loss through the transmission line may be prevented, and interference and disturbance due to a noise from circuit elements or electronic elements mounted on the printed circuit board may be eliminated or reduced.

DETAILED DESCRIPTION

Figure 1:
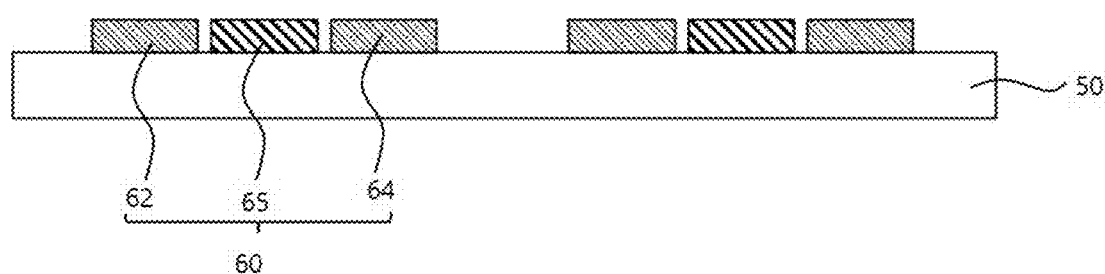
FIGS. 1 and 2 are schematic cross-sectional views illustrating a film transmission line according to exemplary embodiments.

Embodiments of the present invention provide a film transmission line having improved effective efficiency in a predetermined range of thickness. In addition, embodiments of the present invention provide an antenna including the film transmission line and an image display device including the antenna. For example, the film transmission line may be applied to an antenna and an image display device for implementing mobile communication in a high frequency band of 3G to 5G.

Hereinafter, preferred embodiments of the present invention will be described in detail with reference to the accompanying drawings. However, since the drawings attached to the present disclosure are only given for illustrating one of preferable various embodiments of present invention to easily understand the technical spirit of the present invention with the above-described invention, it should not be construed as limited to such a description illustrated in the drawings.

Figure 2:
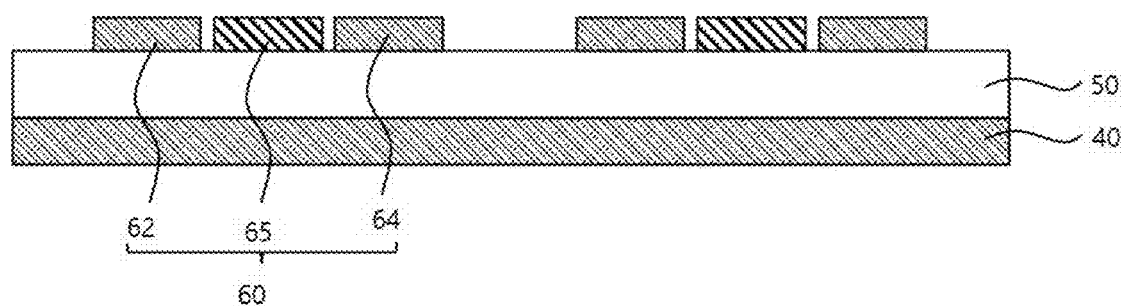

FIGS. 1 and 2 are schematic cross-sectional views illustrating a film transmission line according to exemplary embodiments.

Referring to FIG. 1, the film transmission line may include a dielectric layer 50 and an electrode line 60 disposed on the dielectric layer 50.

The dielectric layer 50 may include an insulation material having a predetermined dielectric constant. As a non-limiting example, the dielectric layer 50 may include an inorganic insulation material such as silicon oxide, silicon nitride, or metal oxide, etc., or an organic insulation material such as an epoxy resin, acrylic resin, imide resin, styrene resin, polyester resin, urethane resin, or cycloolefin resin, etc.

In some embodiments, the dielectric constant of the dielectric layer 50 may be adjusted in a range of about 1.5 to 12. When the dielectric constant exceeds about 12, a driving frequency is excessively reduced, such that driving of the antenna in a desired high frequency band may not be implemented.

The electrode line 60 may be connected with an antenna to be provided as a signal line or a power supply line for performing signal transmission.

The electrode line 60 may include a low resistance metal such as silver (Ag), gold (Au), copper (Cu), aluminum (Al), platinum (Pt), palladium (Pd), chromium (Cr), titanium (Ti), tungsten (W), niobium (Nb), tantalum (Ta), vanadium (V), iron (Fe), manganese (Mn), cobalt (Co), nickel (Ni), zinc (Zn), tin (Sn), or an alloy thereof. These may be used alone or in combination of two or more thereof.

Preferably, the electrode line 60 includes silver or a silver-containing alloy, copper or a copper-containing alloy, or a silver and copper-containing alloy. For example, the electrode line 60 may include a silver-palladium-copper (APC) alloy.

In some embodiments, the electrode line 60 may include a mesh structure made of metal or an alloy thereof.

In some embodiments, the electrode line 60 may include a signal line 65, and ground lines 62 and 64. In some embodiments, the signal line 65 may be disposed between a pair of ground lines, for example, a first ground line 62 and a second ground line 64. The signal line 65, the first ground line 62, and the second ground line 64 may extend substantially parallel to each other.

One electrode line 60 may be defined by the signal line 65, and the first and second ground lines 62 and 64. In some embodiments, a plurality of electrode lines 60 may be arranged on the dielectric layer 50.

According to exemplary embodiments, the electrode line 60 may have an effective efficiency of 200%/μm or more, and the effective efficiency may be defined by Equation 1 below.

$$\text{Effective efficiency} = \frac{\text{Signal transmission efficiency}(\%)}{\text{Electrode line thickness}(\mu m)} \quad \text{[Equation 1]}$$

In the above Equation 1, the signal transmission efficiency may be calculated by Equation 2 below.

$$\text{Signal transmission efficiency}(\%) = \left(\frac{\text{Output power}}{\text{Input power}}\right) \times 100 \quad \text{[Equation 2]}$$

In some embodiments, a target signal loss level S21 of the film transmission line or the antenna including the same may be −3 dB (signal loss level is −3 dB or more). The signal loss level may be calculated by Equation 3 below.

$$S21(dB) = 10 \times \text{Log}\left(\frac{\text{Output power}}{\text{Input power}}\right) \quad \text{[Equation 3]}$$

In some embodiments, the electrode line 60 may have a thickness of about 100 to 500 nm. The thickness of the electrode line 60 may mean, for example, a thickness of each line of the signal line 65, the first ground line 62 and the second ground line 64, and preferably means a thickness of the signal line 65.

If the thickness of the electrode line 60 is less than about 100 nm, a resistance of the electrode line 60 may be excessively increased, thereby causing an increase in the signal loss level. If the thickness of the electrode line 60 exceeds about 500 nm, signal efficiency or signal transmission speed may no longer be increased, and only an entire thickness of the film transmission line may be increased. Accordingly, the above-described effective efficiency value of the film transmission line or the electrode line 60 may be decreased.

For example, as an operation frequency of the film transmission line is increased, a current may be concentrated on a surface portion of a conductive pattern.

Accordingly, a skin depth through which the current substantially flows may be formed.

In one embodiment, in case of using silver, copper, or an alloy thereof (e.g., APC alloy) for lowering the resistance of the electrode line 60 in a frequency band of GHz or more, the surface depth may be formed in a range of about 300 to 500 nm. Accordingly, the film transmission line or the antenna including the same, which satisfies the above-described improved effective efficiency in consideration of the surface depth and the target signal loss level in the frequency band of the film transmission line, may be implemented.

In some embodiments, the electrode line 60 may have a thickness in a range of about 200 to 300 nm. In this case, the effective efficiency of the film transmission line or the electrode line 60 may be further increased.

In some embodiments, the film transmission line or the antenna including the same may be driven in a high frequency band of 5 GHz or more, and in one embodiment, may be driven in an ultrahigh frequency band of 20 GHz or more.

Referring to FIG. 2, the electrode line 60 may be disposed on an upper surface of the dielectric layer 50, and a ground layer 40 may be disposed on a lower surface of the dielectric layer 50.

In some embodiments, various conductive members of the image display device to which the film transmission line is applied may be provided as the ground layer 40. The conductive member may include, for example, a gate electrode of a thin film transistor (TFT), various wirings such as scan lines or data lines, or various electrodes such as pixel electrodes, common electrodes, and the like, which are included in the display panel to be described below.

Figure 3:
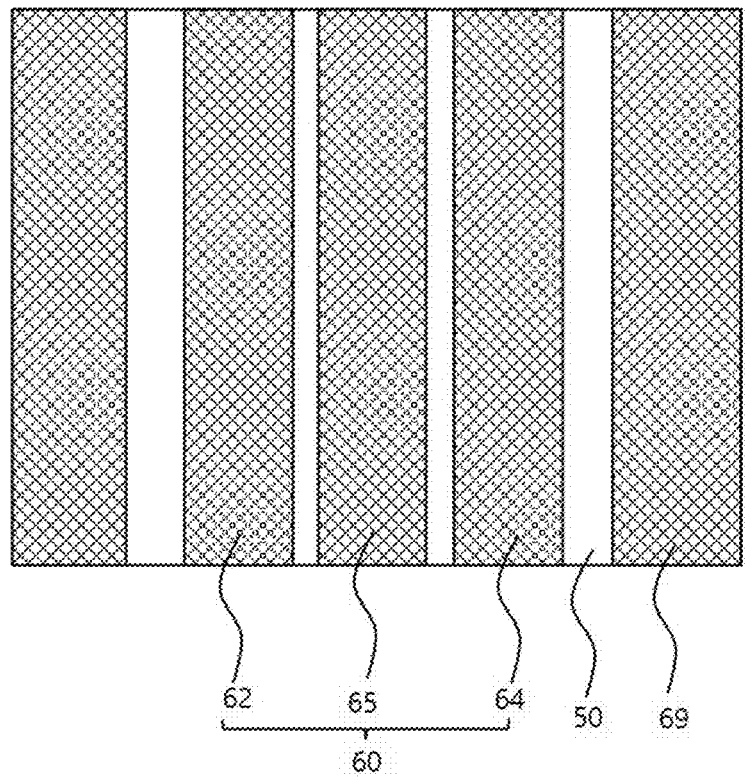
FIG. 3 is a schematic plan view illustrating a film transmission line according to some exemplary embodiments.

FIG. 3 is a schematic plan view illustrating a film transmission line according to some exemplary embodiments.

Referring to FIG. 3, as described with reference to FIGS. 1 and 2, the electrode line 60 is disposed on the dielectric layer 50, and the electrode line 60 may include a mesh structure.

According to exemplary embodiments, a dummy pattern 69 may be disposed around the electrode line 60 on the dielectric layer 50. The dummy pattern 69 may be spaced apart from the electrode line 60 by a predetermined distance to be electrically and physically separated from the electrode line 60.

The dummy pattern 69 may include a mesh structure which is substantially the same as or similar to the electrode line 60. For example, the dummy pattern 69 may be made of the same material as the electrode line 60, and may include a mesh structure having the same line width and aperture ratio as the electrode line 60. Accordingly, an optical deviation due to the electrode line 60 is reduced, so that the electrode line 60 may be prevented from being viewed by a user of the image display device.

Figure 4:
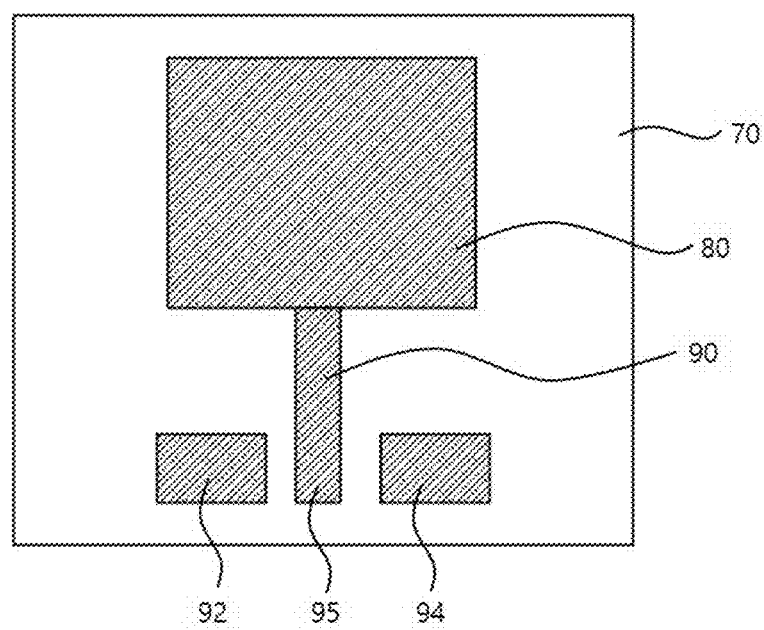
FIG. 4 is a schematic plan view illustrating an antenna electrode structure according to exemplary embodiments.

FIG. 4 is a schematic plan view illustrating an antenna electrode structure according to exemplary embodiments.

Referring to FIG. 4, an antenna electrode coupled to the film transmission line may include a radiation electrode 80, a signal pad 95, and ground pads 92 and 94. For example, the antenna electrode is disposed on an insulation substrate 70, and the insulation substrate 70 may function as a dielectric layer for the antenna electrode.

The antenna electrode may include a metal or alloy which is substantially the same as or similar to the electrode line 60. In some embodiments, the antenna electrode includes a mesh structure, and in this case, the dummy mesh pattern may be arranged around the antenna electrode.

The signal pad 95 may be electrically connected with the radiation electrode 80 through a power supply line 90. For example, an end portion of the power supply line 90 may be provided as the signal pad 95. In some embodiments, the power supply line 90 may be branched from the radiation electrode 80 and may be provided as a single member substantially integrally connected with the radiation electrode 80.

In some embodiments, the signal pad 95 may be disposed between the first ground pad 92 and the second ground pad 94. The antenna electrode may be electrically connected with the electrode line 60 of the film transmission line described with reference to FIGS. 1 to 3. In this case, the signal line 65, the first ground line 62, and the second ground line 64 of the film transmission line may be electrically connected with the signal pad 95, the first ground pad 92, and the second ground pad 94 of the antenna electrode, respectively.

In one embodiment, the antenna electrode and the film transmission line may be connected with each other through a conductive member such as a flexible printed circuit board (FPCB).

Figure 5:
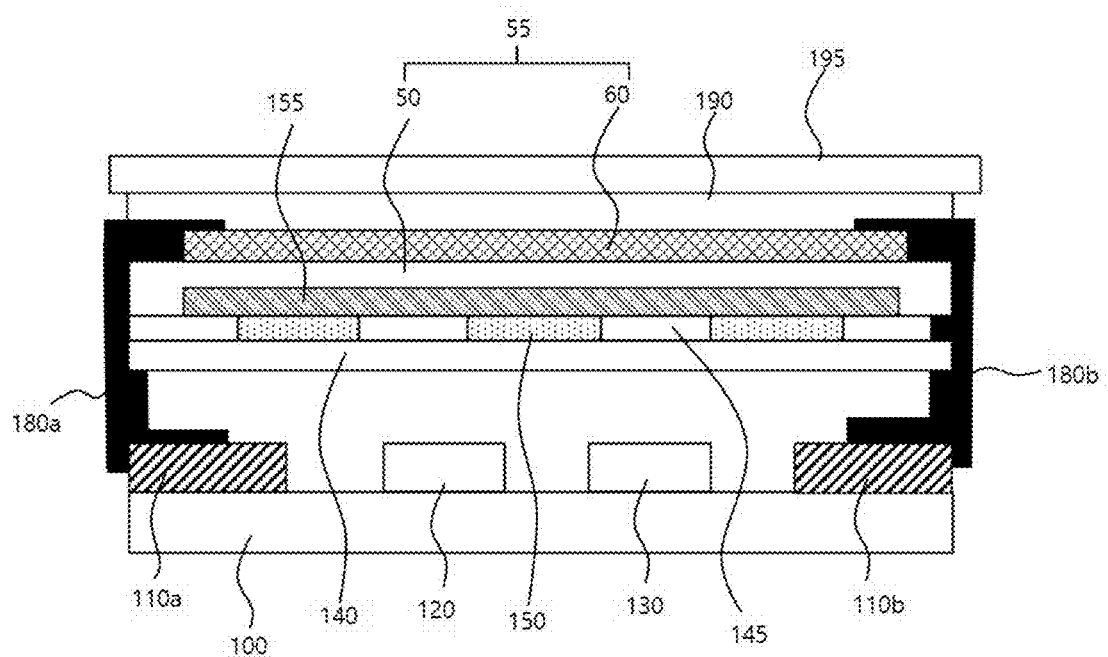
FIG. 5 is a schematic cross-sectional view illustrating an image display device according to exemplary embodiments.

FIG. 5 is a schematic cross-sectional view illustrating an image display device according to exemplary embodiments.

Referring to FIG. 5, the image display device may include a printed circuit board (PCB) 100 and a display panel 140. And, the image display device may include antennas 110*a* and 110*b* mounted on the printed circuit board (PCB) 100 and a film transmission line 55 disposed on the display panel 140.

The printed circuit board 100 may have a structure in which insulation layers and metal layers forming an internal circuit are repeatedly laminated. Connection pads such as solder for connecting the internal circuit and electronic elements may be formed on the printed circuit board 100. For example, the printed circuit board 100 may be provided as a main board of the image display device.

The electronic elements and the antennas 110*a* and 110*b* may be mounted on the printed circuit board 100 through the connection pads, for example. In some embodiments, the electronic elements and the antennas 110*a* and 110*b* may be arranged on a lower surface of the printed circuit board 100. In one embodiment, the electronic elements and the antennas 110*a* and 110*b* may be arranged on the upper and lower surfaces of the printed circuit board 100 in a distributed manner.

A plurality of antennas may be mounted on the printed circuit board 100. The plurality of antennas may have resonance frequencies different from each other.

For example, a first antenna 110*a* and a second antenna 110*b* may be mounted on the printed circuit board 100 in a separated manner, and three or more antennas may be mounted.

The antennas 110*a* and 110*b* may include the antenna electrode including the radiation electrode, the signal pad, and the ground pads as described with reference to FIG. 4. The signal pad and the ground pads are connected with the electrode line 60 included in the film transmission line 55, and may also be connected with the internal circuit of the printed circuit board 100.

The antennas 110*a* and 110*b* may be mounted on the printed circuit board 100 in a form of an antenna patch or an antenna chip, respectively.

The electronic element may include, for example, a display driving integrated circuit (IC) chip 120, a memory element 130 or the like. The memory element 130 may include, for example, a RAM element or a flash memory element.

The electronic element may include an IC chip for driving various sensor elements included in the image display device. For example, the electronic element may include a touch sensor or a driving IC chip of a touch screen panel.

The electronic element may include various circuit structures of the image display device, such as resistors, capacitors and condensers.

The display panel 140 may be disposed on the printed circuit board 100. According to exemplary embodiments, the printed circuit board 100 and the display panel 140 may be spaced apart from each other by a predetermined distance.

For example, the printed circuit board 100 and the display panel 140 are respectively fixed to the image display device by a housing or a bezel thereof, so that a separation space may be formed between the printed circuit board 100 and the display panel 140.

In one embodiment, an insulation structure such as an adhesive layer and a spacer may be disposed in the separation space.

The printed circuit board 100 may correspond to a rear surface of the image display device. And, the printed circuit board 100 which the above-described antennas 110*a* and 110*b* and the electronic element are mounted may be disposed below the display panel 140. An upper side of the display panel 140 may correspond to a front portion of the image display device, on which an image is implemented.

The display panel 140 may include, for example, a thin film transistor (TFT) array substrate. For example, the TFT array substrate may include a base substrate such as a glass substrate or a resin substrate, and a thin film transistor, a scan line, a data line, or the like, which are arranged on the base substrate.

The display panel 140 may include a pixel definition film 145 and a display layer 150 arranged on the TFT array substrate. For example, the pixel electrodes included in the thin film transistor are partially exposed by the pixel definition film 145 to define each pixel, and the display layer 150 may be formed on the surfaces of the exposed pixel electrodes.

The pixel definition film 145 may include an inorganic insulation material or an organic insulation material. The display layer 150 may include, for example, an organic light emitting layer or a liquid crystal layer. When the display layer 150 includes the organic light emitting layer, the image display device may be provided as an organic light emitting diode (OLED) display device. In this case, the display layer 150 may further include a hole transport layer, an electron transport layer and the like.

When the display layer 150 includes the liquid crystal layer, the image display device may be provided as a liquid crystal display (LCD) device. In this case, a backlight, a polarizing plate, and the like may be further disposed between the display panel 140 and the printed circuit board 100.

A reflective electrode 155 may be disposed on the display layer 150. For example, the reflective electrode 155 may be provided as a common electrode extending on a plurality of display layers 150 or the pixels.

The film transmission line 55 described with reference to FIGS. 1 to 3 may be disposed on the display panel. The film transmission line 55 may include the dielectric layer 50 and the electrode line 60. As described with reference to FIG. 1, the electrode line 60 may include the signal line 65, and the ground lines 62 and 64.

The electrode line 60 may be electrically connected with the antennas 110*a* and 110*b* to provide power supply and signal transmission/reception paths between the antenna driving IC chip and the antennas 110*a* and 110*b*.

The electrode line 60 is defined according to the above-described Equation 1, and may have an effective efficiency of 200%/μm or more in a high frequency range. Therefore, it is possible to implement the improved signal efficiency within a limited thickness.

According to exemplary embodiments, the electrode line 60 and the antennas 110a and 110b respectively located on the upper and lower sides of the display panel 140 may be electrically connected with each other by connection structures 180a and 180b.

In some embodiments, the electrode line 60 and the first antenna 110a may be connected with each other by a first connection structure 180a, and the electrode line 60 and the second antenna 110b may be connected with each other by a second connection structure 180b. Thereby, the first and second antennas 110a and 110b disposed below the display panel 140 may be electrically connected or grouped with each other through the electrode line 60.

The connection structures 180a and 180b may include a metal wire or a flexible printed circuit board (FPCB).

As shown in FIG. 5, if the antennas 110a and 110b are mounted on an upper surface of the printed circuit board 100, one end of each of the connection structures 180a and 180b may extend above the display panel 140 to be connected with one end of the electrode line 60. The other end of each of the connection structures 180a and 180b may be bent between, for example, the display panel 140 and the printed circuit board 100 to be connected with each of the antennas 110a and 110b. For example, the other ends of the connection structures 180a and 180b may be electrically connected with the signal pads and/or the ground pads included in the antennas 110a and 110b.

In some embodiments, if the antennas 110a and 110b are mounted on the lower surface of the printed circuit board 100, the connection structures 180a and 180b may extend from one end of the electrode line 60 to the lower surface of the printed circuit board 100 to be connected with the antennas 110a and 110b.

An encapsulation layer 190 may be formed on the film transmission line 55. The encapsulation layer 190 may include an inorganic insulation material such as silicon oxide or silicon nitride, an organic insulation material such as an acrylic resin or an imide resin, or an organic-inorganic hybrid film.

A window substrate 195 may be disposed on the encapsulation layer 190. The window substrate 195 may provide a visible surface to a user of the image display device.

In some embodiments, the image display device may further include a sensor structure such as a touch sensor or a touch screen panel, or an optical structure such as a polarizing plate or a retardation film.

The sensor structure or the optical structure may be disposed between the window substrate 195 and the film transmission line 55. Alternatively, the sensor structure or the optical structure may be disposed between the film transmission line 55 and the display panel 140.

In one embodiment, in order to decrease a signal path through the film transmission line 55 and improve reception sensitivity, the sensor structure or the optical structure may be disposed between the window substrate 195 and the transmission line 55.

As described above, according to exemplary embodiments, the antennas 110a and 110b and the film transmission line 55 may be disposed to be spaced apart from each other at different levels with the display panel 140 interposed therebetween. Accordingly, the film transmission line 55 may be arranged without restriction of a space due to the electronic elements such as the display driving integrated circuit (IC) chip 120 and the memory element 130, and thereby the signal path may be decreased to prevent an increase of the resistance or signal loss through the film transmission line 55.

Figure 6:
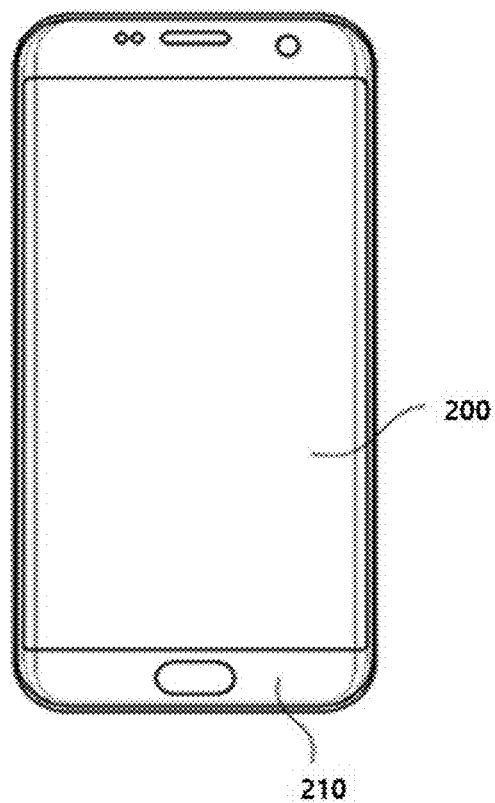
FIGS. 6 and 7 are schematic plan views illustrating an image display device according to exemplary embodiments.
Figure 7:
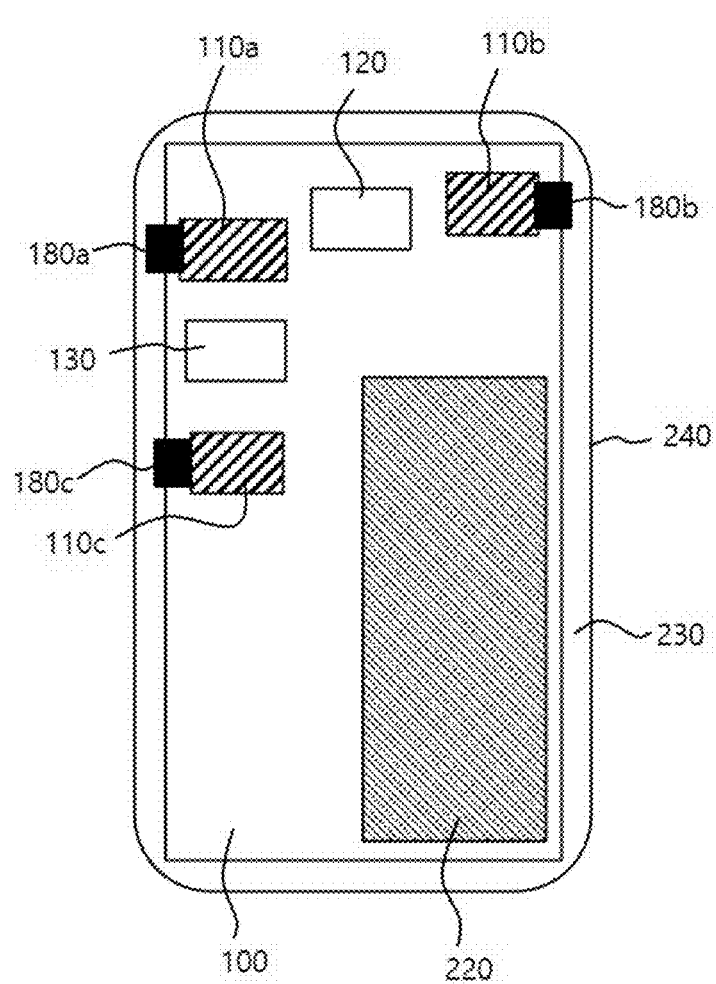

FIGS. 6 and 7 are schematic plan views illustrating an image display device according to exemplary embodiments.

Referring to FIGS. 6 and 7, the image display device may include a display region 200 and a peripheral region 210 on the front portion. An image generated from the display panel 140 shown in FIG. 5 may be displayed to the user through the display region 200. The film transmission line 55 may be disposed on the display panel 140. In one embodiment, since the electrode line 60 includes a substantially transparent mesh structure, a deterioration in image quality may be prevented.

The peripheral region 210 may be regions disposed at both ends and both sides of the display region 200. The peripheral region 210 may include a bezel region 230 between a housing 240 and the printed circuit board 100 of the image display device.

Antennas 110a, 110b and 110c are mounted on the printed circuit board 100, and electronic elements 120 and 130 may be mounted together. In addition, a battery 220 may be coupled to the printed circuit board 100.

As described with reference to FIG. 5, connection structures 180a, 180b and 180c such as a flexible printed circuit board (FPCB) may be connected with the electrode lines 60 disposed on the display panel 140, respectively, and may extend toward the printed circuit board 100 to be connected with the antennas 110a, 110b and 110c through the bezel region 230. Thereby, the antennas 110a, 110b and 110c may be electrically connected with each other through the electrode lines 60 of the film transmission line 55, such that these antennas may be controlled and supplied with a power together through the antenna driving IC chip, for example.

In addition, since the connection structures 180a, 180b and 180c are connected with the antennas 110a, 110b and 110c through the bezel region 230, image implementation in the display region 200 may not be deteriorated. In addition, since the antennas 110a, 110b and 110c and the film transmission line 55 are connected with each other without restriction of an arrangement of the electronic elements 120 and 130, the signal path may be decreased.

Hereinafter, experimental examples including specific examples and comparative examples will be described to more concretely understand the present invention. However, those skilled in the art will appreciate that such examples are provided for illustrative purposes and do not limit subject matters to be protected as disclosed in appended claims. Therefore, it will be apparent to those skilled in the art various alterations and modifications of the embodiments are possible within the scope and spirit of the present invention and duly included within the range as defined by the appended claims.

Experimental Example: Evaluation of Signal Characteristics of Electrode Line Depending on Electrode Thickness An electrode line having a length of 5 mm and a width of 250 μm was formed using silver (Ag), copper (Cu) and an APC alloy on a dielectric layer including glass, cycloolefin polymer (COP) and an adhesive layer.

Signal loss levels S21 (see the above Equation 2) were measured while changing the thickness of the electrode line. Specifically, the signal loss levels were measured by extracting an S-parameter at 28 GHz using a network analyzer. Measured results are shown in a graph of FIG. 8.

Figure 9:
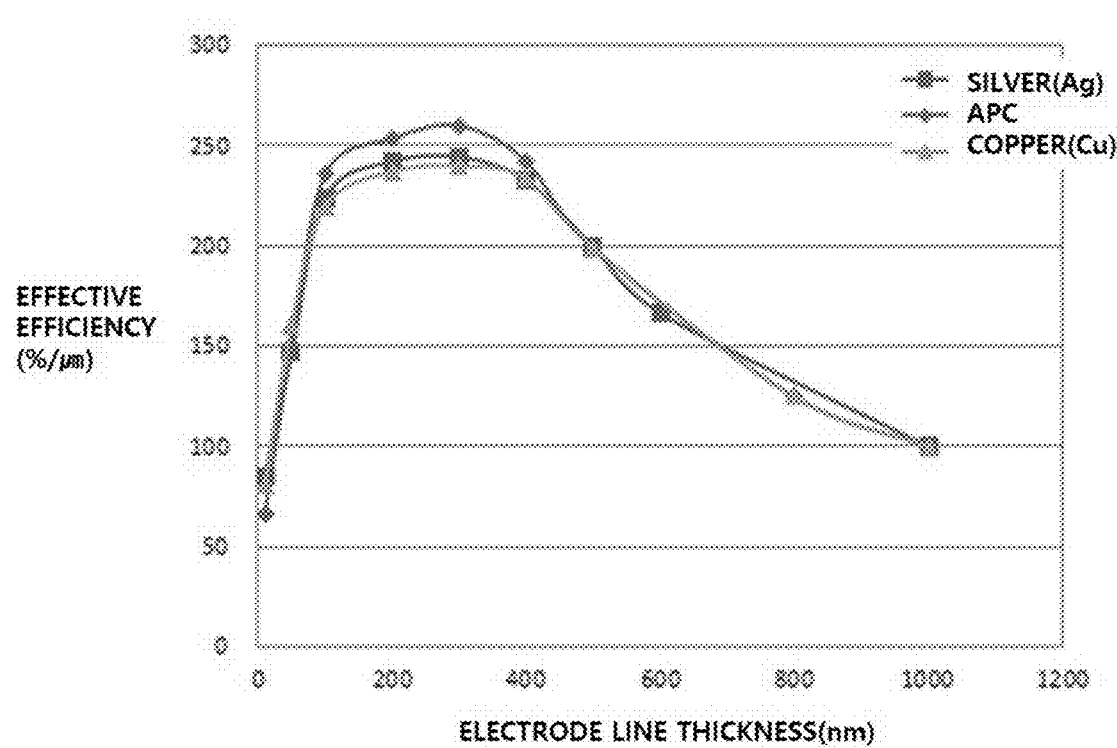
FIG. 9 is a graph illustrating a relationship of effective efficiencies between materials depending on the electrode thickness of the film transmission line.

Additionally, effective efficiency (S21/thickness) values calculated by the above-described Equation 1 were calculated depending on a change in the electrode line thickness, and the calculated values are shown in a graph of FIG. 9.

Figure 8:
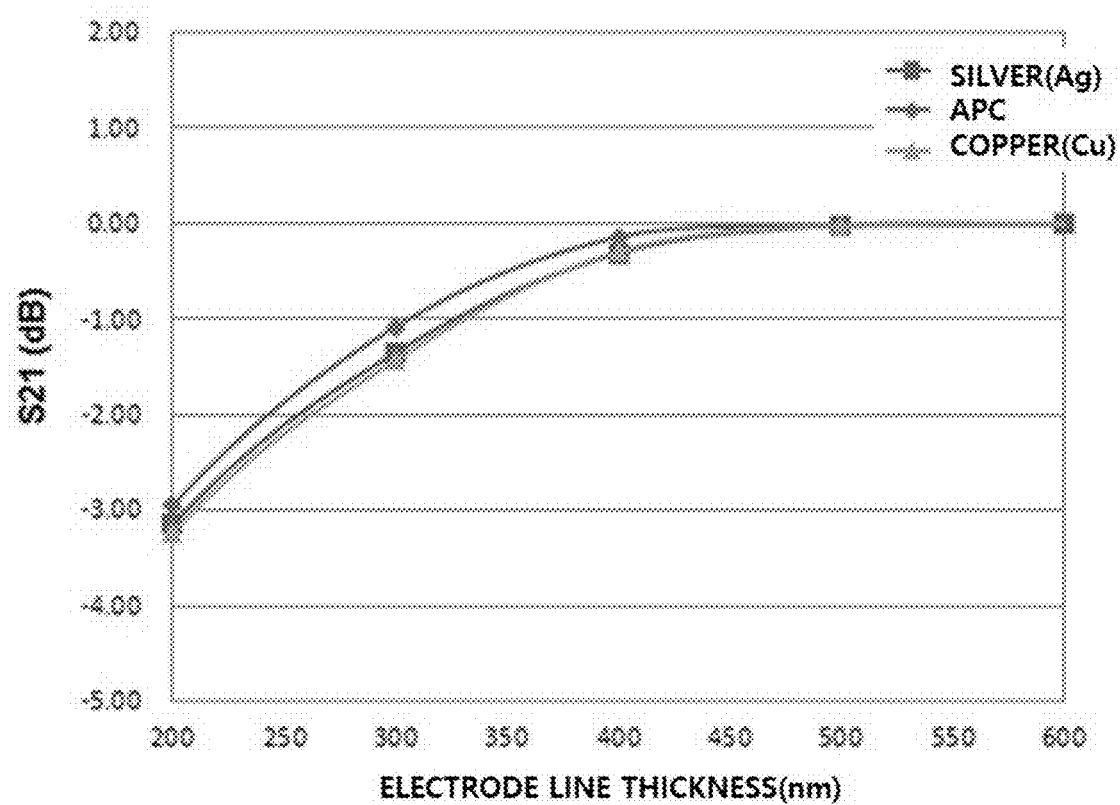
FIG. 8 is a graph illustrating a relationship of signal loss levels S21 between materials depending on an electrode thickness of the film transmission line.

Referring to FIG. 8, signal loss levels of −3 dB or more were obtained when the electrode line has a thickness of about 200 nm. In addition, when the thickness of the electrode line substantially exceeds about 500 nm, the signal characteristics are not improved, and the S21 values are converged to zero.

Referring to FIG. 9, when the thickness of the electrode line exceeds about 500 nm, the effective efficiency is decreased below about 200%/μm. In addition, substantial and excellent effective efficiency values were obtained at a thickness of about 200 to 300 nm.

What is claimed is:

1. A film transmission line comprising:
a dielectric layer; and
an electrode line disposed on the dielectric layer,
wherein the electrode line has an effective efficiency of 200%/μm or more, which is defined by Equation 1 below, at a frequency of 5 GHz or more:

$$\text{Effective efficiency} = \frac{\text{Signal transmission efficiency(\%)}}{\text{Electrode line thickness}(\mu m)} \quad \text{[Equation 1]}$$

Wherein the signal transmission efficiency is defined by Equation 2 below:

$$\text{Signal transmission efficiency(\%)} = \left(\frac{\text{Output power}}{\text{Input power}}\right) \times 100. \quad \text{[Equation 2]}$$

2. The film transmission line according to claim 1, wherein the film transmission line has a signal loss level S21 value of −3 dB or more, which is defined by Equation 3 below, and the electrode line has a thickness of 100 to 500 nm:

$$S21(\text{dB}) = 10 \times \text{Log}\left(\frac{\text{Output power}}{\text{Input power}}\right). \quad \text{[Equation 3]}$$

3. The film transmission line according to claim 2, wherein the electrode line has a thickness of 200 to 300 nm.

4. The film transmission line according to claim 1, wherein the electrode line comprises a signal line and a ground line.

5. The film transmission line according to claim 4, wherein the ground line comprises a first ground line and a second ground line, and the signal line is disposed between the first ground line and the second ground line.

6. The film transmission line according to claim 1, wherein the electrode line comprises at least one selected from the group comprising silver (Ag), gold (Au), copper (Cu), aluminum (Al), platinum (Pt), palladium (Pd), chromium (Cr), titanium (Ti), tungsten (W), niobium (Nb), tantalum (Ta), vanadium (V), iron (Fe), manganese (Mn), cobalt (Co), nickel (Ni), zinc (Zn), tin (Sn), and an alloy thereof.

7. The film transmission line according to claim 6, wherein the electrode line comprises silver, copper or an alloy thereof.

8. The film transmission line according to claim 1, wherein the electrode line comprises a mesh structure.

9. The film transmission line according to claim 8, further comprising a dummy pattern disposed around the electrode line and having a same mesh structure as the mesh structure of the electrode line.

10. The film transmission line according to claim 1, wherein the film transmission line further comprises a ground layer disposed on a lower surface of the dielectric layer.

11. The film transmission line according to claim 1, wherein the film transmission line is driven at a frequency of 20 GHz or more.

12. An antenna comprising:
the film transmission line according to claim 1; and
an antenna electrode electrically connected with the film transmission line.

13. The antenna according to claim 12, wherein the antenna electrode comprises a radiation electrode, and a pad electrode electrically connected with the electrode line of the film transmission line.

14. An image display device comprising:
a printed circuit board;
an antenna mounted on the printed circuit board;
a display panel disposed on the printed circuit board; and
the film transmission line according to claim 1 disposed on the display panel and electrically connected with the antenna.

15. The image display device according to claim 14, wherein the image display device further comprises an electronic element mounted on the printed circuit board.

16. The image display device according to claim 14, wherein the image display device further comprises a connection structure electrically connecting the film transmission line and the antenna with each other.

17. The image display device according to claim 16, wherein the connection structure comprises a flexible printed circuit board (FPCB).

18. The image display device according to claim 17, wherein the connection structure is connected with one end of the electrode line included in the film transmission line, and extends toward the printed circuit board through a peripheral region of the image display device to be connected with the antenna.

* * * * *